United States Patent
Ha

(10) Patent No.: US 12,085,990 B2
(45) Date of Patent: Sep. 10, 2024

(54) CHIP-ON-FILM PACKAGE, DISPLAY MODULE INCLUDING SAME, AND ELECTRONIC DEVICE INCLUDING SAME

(71) Applicant: SAMSUNG ELECTRONICS CO., LTD., Suwon-si (KR)

(72) Inventor: Jeongkyu Ha, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/340,681

(22) Filed: Jun. 23, 2023

(65) Prior Publication Data

US 2023/0333599 A1 Oct. 19, 2023

Related U.S. Application Data

(63) Continuation of application No. 17/003,291, filed on Aug. 26, 2020, now Pat. No. 11,836,006.

(30) Foreign Application Priority Data

Feb. 19, 2020 (KR) .................. 10-2020-0020547

(51) Int. Cl.
| | |
|---|---|
| *G06F 1/16* | (2006.01) |
| *G06F 1/18* | (2006.01) |
| *G09F 9/30* | (2006.01) |
| *H01L 33/48* | (2010.01) |

(52) U.S. Cl.
CPC ............ *G06F 1/1652* (2013.01); *G06F 1/181* (2013.01); *G06F 1/189* (2013.01); *G09F 9/301* (2013.01); *H01L 33/48* (2013.01)

(58) Field of Classification Search
CPC ........ G06F 1/1652; G06F 1/181; G06F 1/189; G09F 9/301; H01L 33/48; H01L 2224/16225; H01L 2224/32225; H01L 2224/73204; H01L 23/4985; H01L 23/145; H01L 23/16; H01L 23/5387;
(Continued)

(56) References Cited

U.S. PATENT DOCUMENTS

| | | |
|---|---|---|
| 6,657,606 B2 | 12/2003 | Kang et al. |
| 6,670,696 B2 | 12/2003 | Toyosawa et al. |
| 7,176,568 B2 | 2/2007 | Urushido |

(Continued)

FOREIGN PATENT DOCUMENTS

| | | |
|---|---|---|
| JP | 3722223 | 11/2005 |
| JP | 2006-073966 | 3/2006 |

(Continued)

*Primary Examiner* — Jonathan Han
(74) *Attorney, Agent, or Firm* — Fish & Richardson P.C.

(57) ABSTRACT

A chip-on-film (COF) package includes a film including a reinforcement area, a bending area and a chip mounting area, a conductive pattern layer disposed on the film in the reinforcement area and in the bending area, and at least partially in the chip mounting area, a chip mounted on a portion of the conductive pattern layer in the chip mounting area, a first insulating layer having a first elastic modulus and extending over the conductive pattern layer in the reinforcement area, and a second insulating layer having a second elastic modulus and extending over the conductive pattern layer in the bending area, wherein the first elastic modulus is greater than the second elastic modulus, and the film is intact in the chip mounting area.

19 Claims, 15 Drawing Sheets

(58) Field of Classification Search
CPC .............. H01L 23/481; H01L 23/485; H01L 23/49572; H01L 24/06; H01L 24/09; H01L 2924/00

See application file for complete search history.

(56) References Cited

U.S. PATENT DOCUMENTS

| | | | |
|---|---|---|---|
| 8,344,486 B2 | 1/2013 | Nakagawa et al. | |
| 8,576,567 B2 | 11/2013 | Katoh et al. | |
| 8,756,567 B2 | 6/2014 | Jentsch et al. | |
| 9,093,443 B2* | 7/2015 | Lee | F21K 9/00 |
| 9,113,545 B2 | 8/2015 | Han et al. | |
| 9,583,448 B2 | 2/2017 | Ahn | |
| 9,768,106 B2 | 9/2017 | Cho et al. | |
| 9,922,891 B2* | 3/2018 | Lim | H01L 23/66 |
| 10,134,667 B2 | 11/2018 | Kim et al. | |
| 2014/0306348 A1* | 10/2014 | Ahn | H05K 1/0281 |
| | | | 257/773 |
| 2018/0182983 A1 | 6/2018 | Bae et al. | |
| 2020/0183457 A1* | 6/2020 | Youn | G06F 1/1641 |

FOREIGN PATENT DOCUMENTS

| | | |
|---|---|---|
| JP | 4146990 | 9/2008 |
| KR | 10-0589459 | 11/2006 |
| KR | 10-2006-0134698 | 12/2006 |
| KR | 10-2014-0123852 | 10/2014 |
| KR | 10-1991892 | 6/2019 |

* cited by examiner

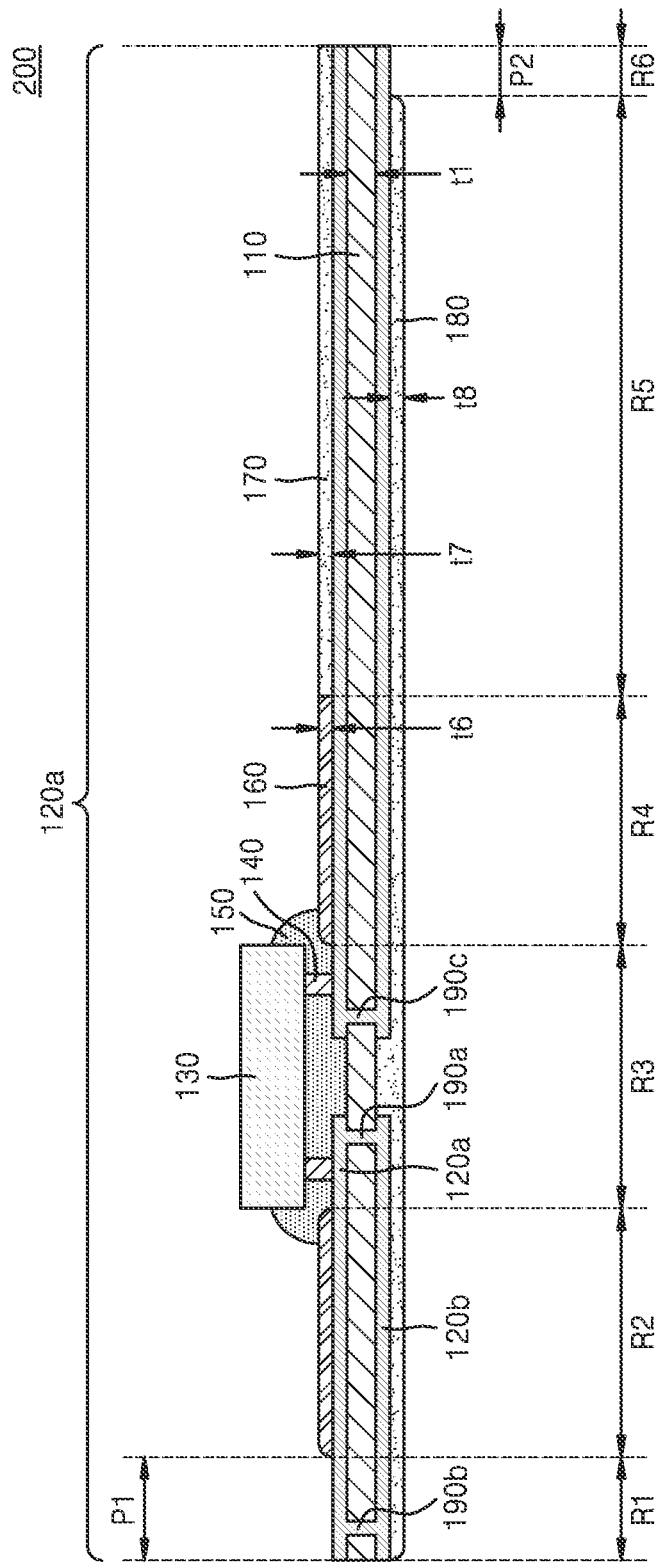

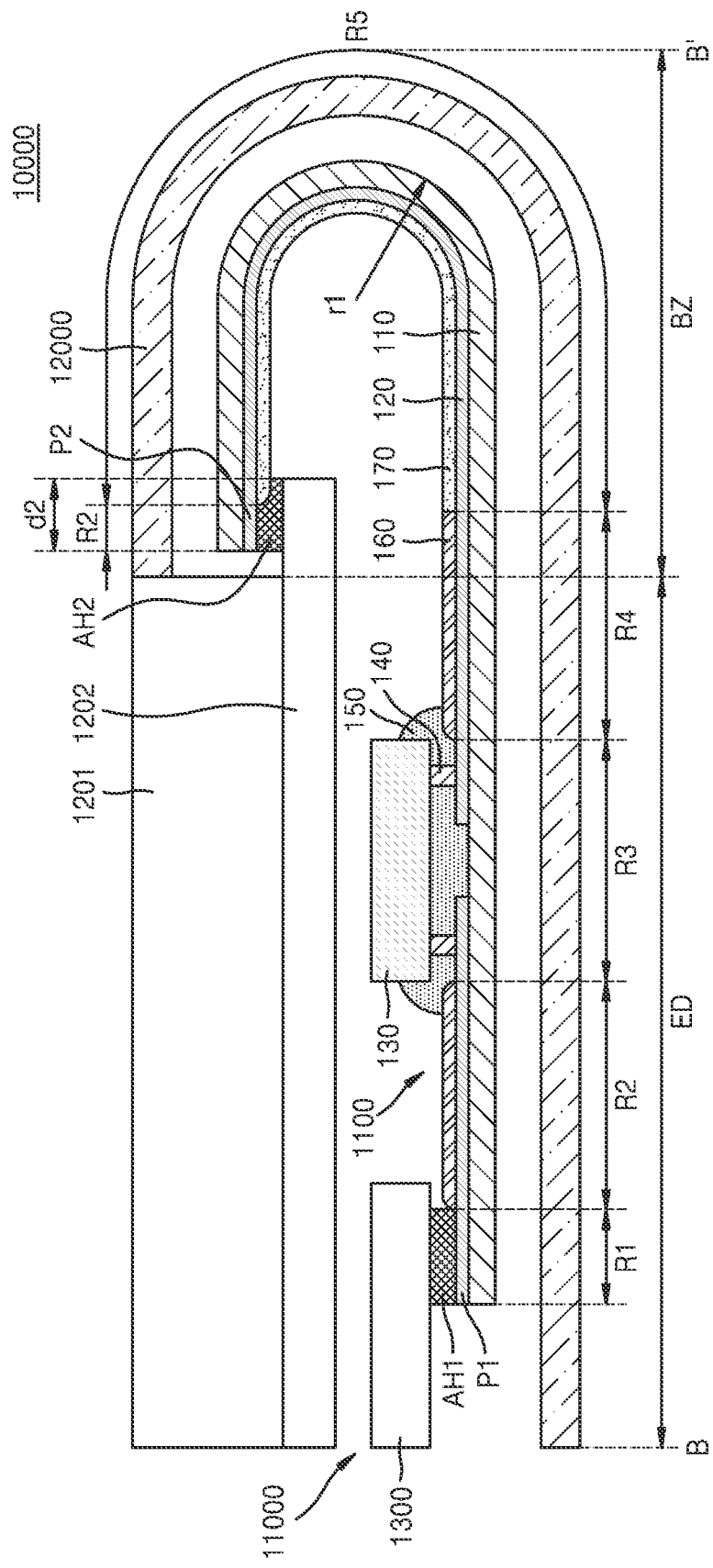

CHIP-ON-FILM PACKAGE, DISPLAY MODULE INCLUDING SAME, AND ELECTRONIC DEVICE INCLUDING SAME

CROSS-REFERENCE TO RELATED APPLICATION

This application is a continuation of U.S. application Ser. No. 17/003,291, filed Aug. 26, 2020, which claims the benefit of Korean Patent Application No. 10-2020-0020547 filed on Feb. 19, 2020, in the Korean Intellectual Property Office, the subject matter of each of which is hereby incorporated by reference.

BACKGROUND

The inventive concept relates generally to chip-on-film (COF) package(s). More specifically, the inventive concept relates to COF packages in which at least a portion of the COF package is bendable.

A display driver integrated circuit chip may be packaged in a tape-carrier-package (TCP) or a chip-on-film (COF) package. Both the TCP and the COF package are structures in which a chip may be mounted on a film on which a conductive pattern is formed.

SUMMARY

Embodiments of the inventive concept provide a COF package enabling the implementation of an electronic device including the COF package and having a reduced bezel length. Embodiments of the inventive concept provide a COF package in which the risk of display panel detachment from the COP package is greatly reduced. Embodiments of the inventive concept provide a COF package that facilitates the safe handling and assembly of the COF package using a reduced film thickness.

According to an aspect of the inventive concept, there is provided a chip-on-film (COF) package including; a film including a reinforcement area, a bending area and a chip mounting area, a conductive pattern layer disposed on the film in the reinforcement area and in the bending area, and at least partially in the chip mounting area, a chip mounted on a portion of the conductive pattern layer in the chip mounting area, a first insulating layer having a first elastic modulus and extending over the conductive pattern layer in the reinforcement area, and a second insulating layer having a second elastic modulus and extending over the conductive pattern layer in the bending area, wherein the first elastic modulus is greater than the second elastic modulus, and the film is intact in the chip mounting area.

According to an aspect of the inventive concept, there is provided a chip-on-film (COF) package including; a film including a first pad area at one end of the film, a second pad area at another end of the film, a chip mounting area between the first pad area and the second pad area, a first reinforcement area between the chip mounting area and the first pad area, a second reinforcement area between the chip mounting area and the second pad area, and a bending area between the second reinforcement area and the second pad area, first conductive pads disposed on the first pad area, second conductive pads disposed on the second pad area, first conductive lines extending from the chip mounting area through the first reinforcement area and respectively connected to the first conductive pads, second conductive lines extending from the chip mounting area through the second reinforcement area and the bending area and respectively connected to second conductive pads, a chip mounted on portions of the first conductive lines and portions of the second conductive lines in the chip mounting area, conductive bumps disposed between the first conductive lines and the chip and between the second conductive lines and the chip, a sealing part covering a top surface of the chip mounting area and at least partially surrounding the conductive bumps, a first insulating layer having a first elastic modulus, exposing the first conductive pads, and covering the first conductive lines in the first reinforcement area and the second conductive lines in the second reinforcement area, and a second insulating layer having a second elastic modulus, exposing the second conductive pads, and covering the second conductive lines in the bending area, wherein the first elastic modulus is greater than the second elastic modulus and the sealing part does not contact a bottom surface of the film in the chip mounting area.

According to an aspect of the inventive concept, there is provided an electronic device including a housing, and the display module according to the foregoing disposed in the housing, wherein the bending area is bent such that the second conductive pads are attached to a top surface of the display panel and the chip is disposed between the film and a bottom surface of the display panel.

According to an aspect of the inventive concept, there is provided a chip-on-film (COF) package including; a film, a first conductive pattern layer disposed on a top surface of the film, a second conductive pattern layer disposed on a bottom surface of the film, a through via penetrating the film and connecting the first conductive pattern layer and the second conductive pattern layer, a chip mounted on the first conductive pattern layer, a first insulating layer having a first elastic modulus and covering at least a portion of the top surface adjacent to the chip, a second insulating layer having a second elastic modulus and covering at least a portion of the top surface spaced apart from the chip and a third insulating layer having a third elastic modulus covering at least a portion of the bottom surface, wherein the first elastic modulus is greater than the second elastic modulus.

BRIEF DESCRIPTION OF THE DRAWINGS

Embodiments of the inventive concept may be more clearly understood upon consideration of the following detailed description taken in conjunction with the accompanying drawings in which:

FIGS. 3, 4, 5, 6A, 6B, 7A and 7B are cross-sectional views respectively illustrating COF packages according to embodiments of the inventive concept;

FIG. 11 is a cross-sectional view further illustrating the electronic device of FIG. 10 taken along the line B-B'.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

As noted above, display driver integrated circuit chips may be packaged using a tape-carrier-package (TCP) or a chip-on-film (COF) package. Both TCP and the COF package allow a semiconductor chip to be mounted on a film including a conductive pattern. However, the TCP usually forms a hole in a chip mounting region of the constituent film. Accordingly, a portion of the conductive pattern (e.g., an inner-lead) extending above the hole may not be supported by the film. In contrast, the COF package does not form a hole in the chip mounting region of the film, such that the conductive pattern is fully supported by the film. Accordingly, the COF package may be advantageously used in the context of the inventive concept to miniaturize the conductive pattern, as compared with the TCP.

Figure 1:
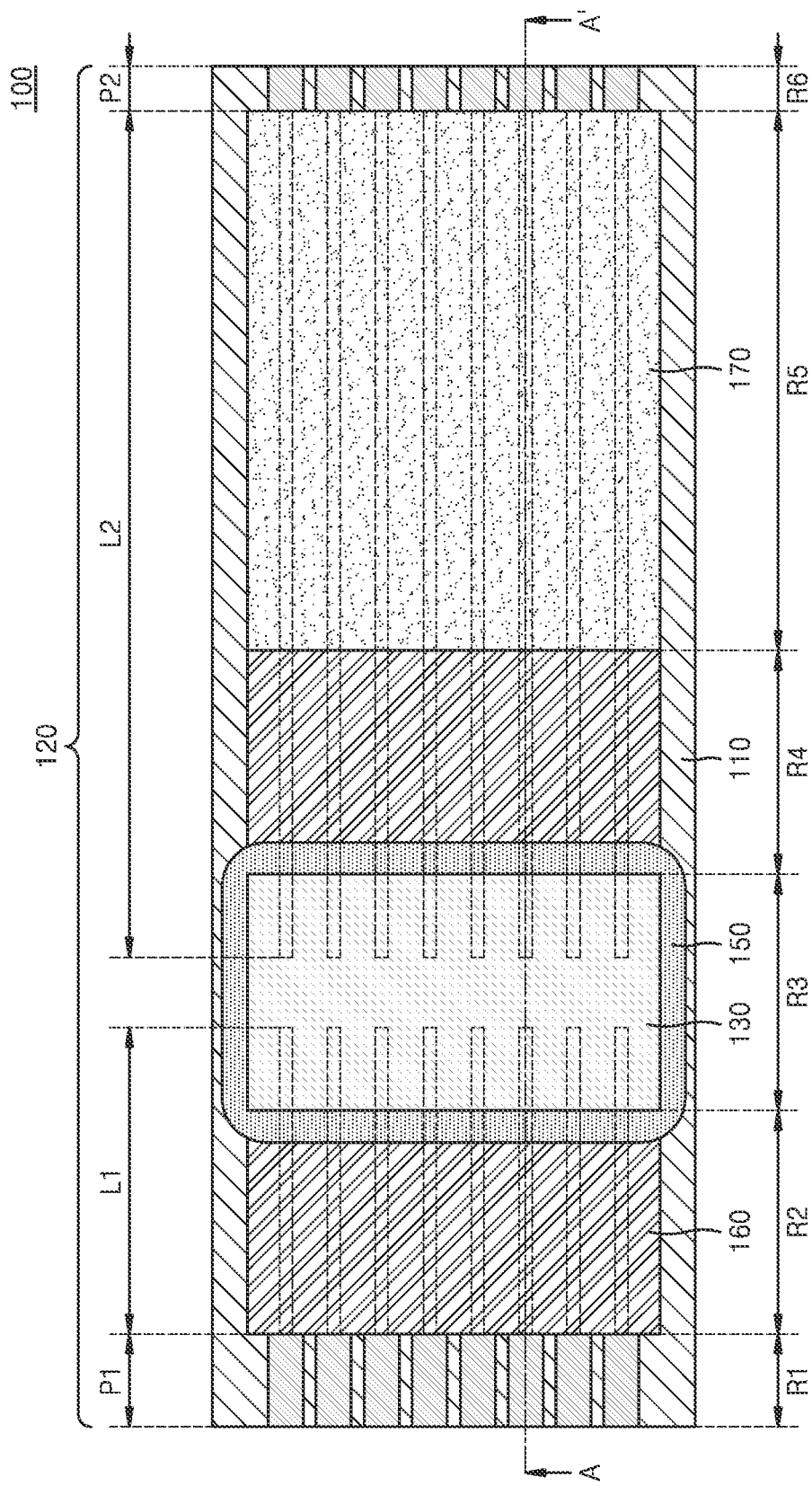
FIG. 1 is a plan view illustrating a COF package according to embodiments of the inventive concept.
Figure 2:
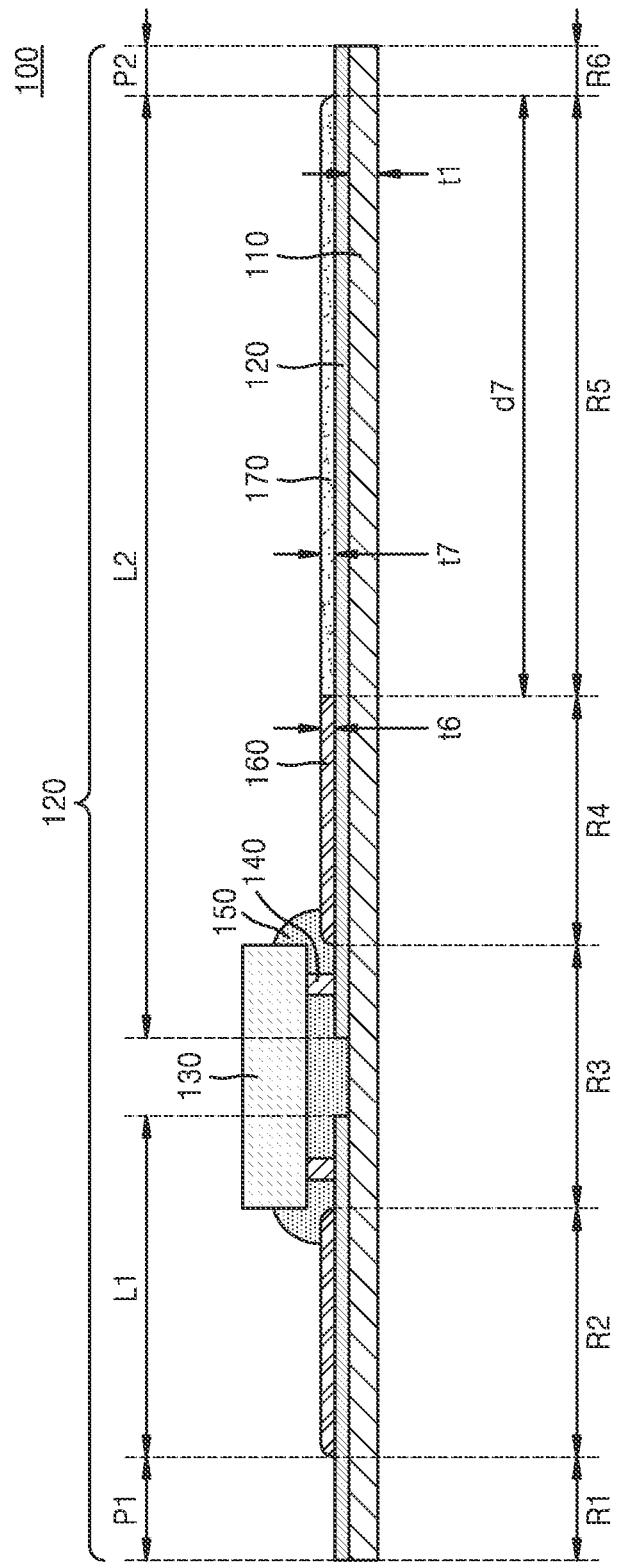
FIG. 2 is a cross-sectional view further illustrating the COF package of FIG. 1 taken along the line A-A'.

Figure (FIG. 1 is a plan (or top down) view illustrating a chip-on-film (COF) package 100 according to embodiments of the inventive concept. FIG. 2 is a cross-sectional view of the COF package 100 taken along the line A-A' in FIG. 1.

Referring to FIGS. 1 and 2, the COF package 100 may include a film 110, a conductive pattern layer 120 on the film 110, a chip 130 at least partially on the conductive pattern layer 120, a first insulating layer 160 on the conductive pattern layer 120 and a second insulating layer 170 on the conductive pattern layer 120. In some embodiments, the COF package 100 may further include a conductive bump 140 between the chip 130 and the conductive pattern layer 120. In some embodiments, the COF package 100 may further include a sealing part 150 at least partially surrounding the conductive bump 140.

In the illustrated example of FIG. 1, it is assumed that the conductive patter layer 120 extends laterally across an entire length of the film 100 (including, e.g., regions R1, R2, R3, R4, R5 and R6), however, this need not always be the case.

The film 110 may be understood as including a first pad area R1 at one end of the film 110, a second pad area R6 at another end of the film 110 opposing the one end, a chip mounting area R3 between the first pad area R1 and the second pad area R6, a first reinforcement area R2 between the chip mounting area R3 and the first pad area R1, a second reinforcing region R4 between the chip mounting area R3 and the second pad area R6 and a bending region R5 between the second reinforcing region R4 and the second pad region R6. Here, the first reinforcement area R2 and the second reinforcement area R4 may be adjacent to the chip mounting area R3, the first pad area R1 may be adjacent to the first reinforcement area R2, the bending area R5 may be adjacent to the second reinforcement area R4, and the second pad area R6 may be adjacent to the bending area R5. In the illustrated example of FIG. 1, the first reinforcement area R2 and the second reinforcement area R4 are spaced apart from each other. However, in other embodiments, the first reinforcement area R2 and the second reinforcement area R4 may be adjacent to each other in a configuration that at least partially surrounds the chip mounting area R3.

As will be described in some additional with respect to the embodiment illustrated in FIG. 11, a thickness t1 of the film 110 may be less than about 35 μm, which is the general thickness of comparative films used in conventional COF packages. Here, it should be noted that a thickness of about 35 μm or less prevents the COF package 100 from becoming detached from a display panel due to the elasticity of the film 110. In this regard, a polyimide film having a thickness of 25 μm may be used, which is the thinnest film 110 for the COF package currently available.

The thickness t1 of the film 110 may be in a range of from about 10 μm to about 30 μm. When the thickness t1 of the film 110 is less than about 10 μm, however, the assembly and handling of the COF package 100 may be difficult. Yet, when the thickness t1 of the film 110 is greater than about 30 μm, the COF package 100 may become detached from the display panel due to the elasticity of the film 110. In this regard, the term "thickness" used in the description of a layer or film refers to an average thickness. Accordingly, the thickness of the layer or film may refer to a resultant value derived by dividing the volume of the layer or film by a horizontal (or lateral) area of the layer or film.

The film 110 may include one or more material(s) generally possessing an insulating and flexible nature. The film 110 may include, for example, polyimide, polyester, or a combination thereof. The film 110 may have a top surface on which the conductive pattern layer 120 is formed and a bottom surface opposing the top surface.

The conductive pattern layer 120 may be positioned (or disposed) on the top surface of the film 110. In some embodiments, the conductive pattern layer 120 may include one or more first conductive pads P1 (hereafter, "first conductive pads P1"), one or more first conductive lines L1 (hereafter, "first conductive lines L1"), one or more second conductive lines L2 (hereafter, "second conductive lines L2"), and one or more second conductive pads P2 (hereafter, "second conductive pads P2"), wherein the first conductive pads P1 are disposed on the first pad area R1 and the second conductive pads P2 is disposed on the second pad area R6.

The first conductive lines L1 may extend from the chip mounting area R3 through the first reinforcement area R2 to respectively connect the first conductive pads P1, and the second conductive lines L2 may extend from the chip mounting area R3 through the second reinforcement area R4 and the bending area R5 to respectively connect the second conductive pads P2. At least a portion of the conductive pattern layer 120 (e.g., the first conductive pads P1, the first conductive lines L1, the second conductive lines L2, and/or the second conductive pads P2) may include at least one conductive material including, for example, copper (Cu), aluminum (Al), gold (Au), silver (Ag), titanium (Ti) and/or tungsten (W). In some embodiments, the thickness of the conductive pattern layer 120 may be in a range of from about 5 μm to about 15 μm (e.g., about 8 μm). In this regard, when the thickness of the conductive pattern layer 120 is less than about 5 μm, the resistance of the conductive pattern layer 120 may increase and fine patterning of the conductive pattern layer 120 may be difficult. However, when the thickness of the conductive pattern layer 120 is greater than about 15 μm, the flexibility of the COF package may be adversely reduced and/or the overall thickness of the COF package may increase.

The chip 130 may be mounted on a portion of the conductive pattern layer 120 in the chip mounting area R3. For example, the chip 130 may be mounted on portions of the first conductive lines L1 and/or portions of the second conductive lines L2 in the chip mounting area R3.

In some embodiments, the chip 130 may be a display driver integrated circuit (DDI) chip. In this case, the chip 130 may be used to control the operation of pixels in a display panel. That is, the chip 130 may include a gate driving integrated circuit for driving a gate line and/or a data driving integrated circuit for driving a data line. In some embodiments, the chip 130 may further include a timing controller, graphic random access memory (RAM) (GRAM), and/or a power driver in addition to the display driver integrated circuit.

In some embodiments, one or more conductive bump(s) 140 may be disposed between the chip 130 and the conductive pattern layer 120. For example, conductive bumps 140 may be respectively disposed between the first conductive lines L1 and the chip 130, and between the second conductive lines L2 and the chip 130. The conductive bumps 140 may include one or more conductive material(s) including, for example, tin (Sn), lead (Pb), copper (Cu), aluminum (Al), gold (Au), silver (Ag), titanium (Ti) and/or tungsten (W). With this exemplary configuration, the chip 130 may be connected to the first conductive pads P1 through conductive bumps 140 and the first conductive lines L1, as well as to the second conductive pads P2 through the conductive bumps 140 and the second conductive lines L2.

In some embodiments, the sealing part. 150 may be used to encompass (or cover) the conductive bumps 140. That is, the sealing part 150 may be used to cover at least part of a top surface of the chip mounting area R3 including the conductive bumps 140, portions of the first conductive lines L1, and/or portions of the second conductive lines L2. In some embodiments, the sealing part 150 may further cover at least a portion of the first insulating layer 160.

The sealing part 150 may include one or more material(s) including, for example, epoxy, silicone, polymethyl methacrylate (PMMA), polyethylene and/or polystyrene. Unlike certain tape-carrier-packages (TCP), the chip mounting area R3 of the film 110 in the COF package 100 of FIG. 1 will not include a hole vertically penetrating the film 110 (i.e., a structure that penetrates the film 110 in a direction defining a thickness of the film). Accordingly, the sealing part 150 will not penetrate through the film 110 or make contact with a bottom surface of the film 110 in the chip mounting area R3. Thus, in certain embodiments of the inventive concept, the portion of the film 110 substantially used to mount the chip 130 (i.e., the chip mounting area R3) may be said to be "intact" (i.e., remains unbroken or unpenetrated by a vertical (or partially vertical) feature or element). In this regard, the term "vertical" assumes that the principal, top and bottom surfaces of the film 110 extend in a "horizontal" direction. However, those skilled in the art will recognize that these geometric descriptions are relative in nature.

The first insulating layer 160 may cover portions of the conductive pattern layer 120 in the first reinforcement area R2 and the second reinforcement area R4. For example, the first insulating layer 160 may cover the first reinforcement area R2, portions of the first conductive lines L1 traversing the first reinforcement area R2, the second reinforcement area R4, and portions of the second conductive lines L2 traversing the second reinforcement area R4. However, the first insulating layer 160 may expose the first conductive pads P1.

The second insulating layer 170 may cover the bending area R5 and portions of the conductive pattern layer 120 traversing the bending area R5. For example, the second insulating layer 170 may cover the bending area R5 and portions of the second conductive lines L2 traversing the bending area R5. However, the second insulating layer 170 may expose the second conductive pads P2.

With this exemplary configuration, portions of the first conductive lines L1 traversing the first reinforcement area R2 may be covered by the first insulating layer 160, and portions of the second conductive lines L2 traversing the second reinforcement area R4 and the bending area R5 may be covered by the second insulating layer 170.

Here, in certain embodiments of the inventive concept, a first elastic modulus of the first insulating layer 160 may be greater than a second elastic modulus of the second insulating layer 170. For example, the first elastic modulus of the first insulating layer 160 may be in a range of from about 5 GPa to about 20 GPa, and the second elastic modulus of the second insulating layer 170 may be in a range of from about 0.5 GPa to about 2 GPa.

In this regard, the first insulating layer 160—having a relatively high elastic modulus—may help prevent damage to the film 110 during the assembly and handling of the COF package 100 and facilitate the handling of the film 110. As will be described in some additional detail with reference to FIG. 11, the second insulating layer 170—having a relatively low elastic modulus—may facilitate the bending of the bending area R5 of the film 110, and thus, may prevent the COF package from becoming detached from the display panel even though the attachment length between the COF package and the display panel is reduced.

Further in this regard, when the first elastic modulus of the first insulating layer 160 is less than about 5 GPa, the film 110 may be damaged during the assembly and handling of the COF package 100, but when the first elastic modulus of the first insulating layer 160 is greater than about 20 GPa, the bendability of the bending area R5 may be insufficient. When the second elastic modulus of the second insulating layer 170 is less than about 0.5 GPa, the film 110 may be damaged during the assembly and handling of the COF package 100, but when the second elastic modulus of the second insulating layer 170 is greater than about 2 GPa, the bendability of the bending area R5 may not be insufficient to prevent detachment (or partial detachment) of a display panel.

Still further in this regard, first material(s) used to form the first insulating layer 160 may be different from second material(s) used to form the second insulating layer 170. In certain embodiments of the inventive concept, the first insulating layer 160 may include (e.g.,) polyimide, and the second insulating layer 170 may include (e.g.,) polyurethane. Here, polyimide may have a higher elastic modulus than polyurethane, and may also exhibit a relatively high resistance to chemicals (e.g., glass cleaners), thereby improving the reliability of the resulting COF package.

Referring again to FIG. 1, a thickness to of the first insulating layer 160 and a thickness t7 of the second insulating layer 170 may be in a range of from about 5 μm to about 35 μm. However, when the thickness t6 of the first insulating layer 160 and/or the thickness t7 of the second insulating layer 170 are less than about 5 μm, the first insulating layer 160 and the second insulating layer 170 may not provide sufficient insulation properties. And when the thickness 16 of the first insulating layer 160 and the thickness t7 of the second insulating layer 170 are greater than about 35 μm, the total thickness of the COF package 100 may increase too much, and the resulting flexibility of the COF package 100 may be reduced to a point where a display panel becomes detached.

In certain embodiments of the inventive concept, the thickness 16 of the first insulating layer 160 may be the same as the thickness t7 of the second insulating layer 170 (e.g., in arrange of from about 10 μm or about 20 μm). In some embodiments, a length d7 of the second insulating layer 170 may be in a range of from about 1.5 mm to about 3.0 mm. However, when the length d7 of the second insulating layer 170 is greater than about 3.0 mm, the size of a resulting bezel for an incorporating electronic device may become too large, and when the length d7 of the second insulating layer 170 is less than about 1.5 mm, the bending area R5 of the film 110 may become so short that a display panel become detached from the COF package 100.

Figure 3:
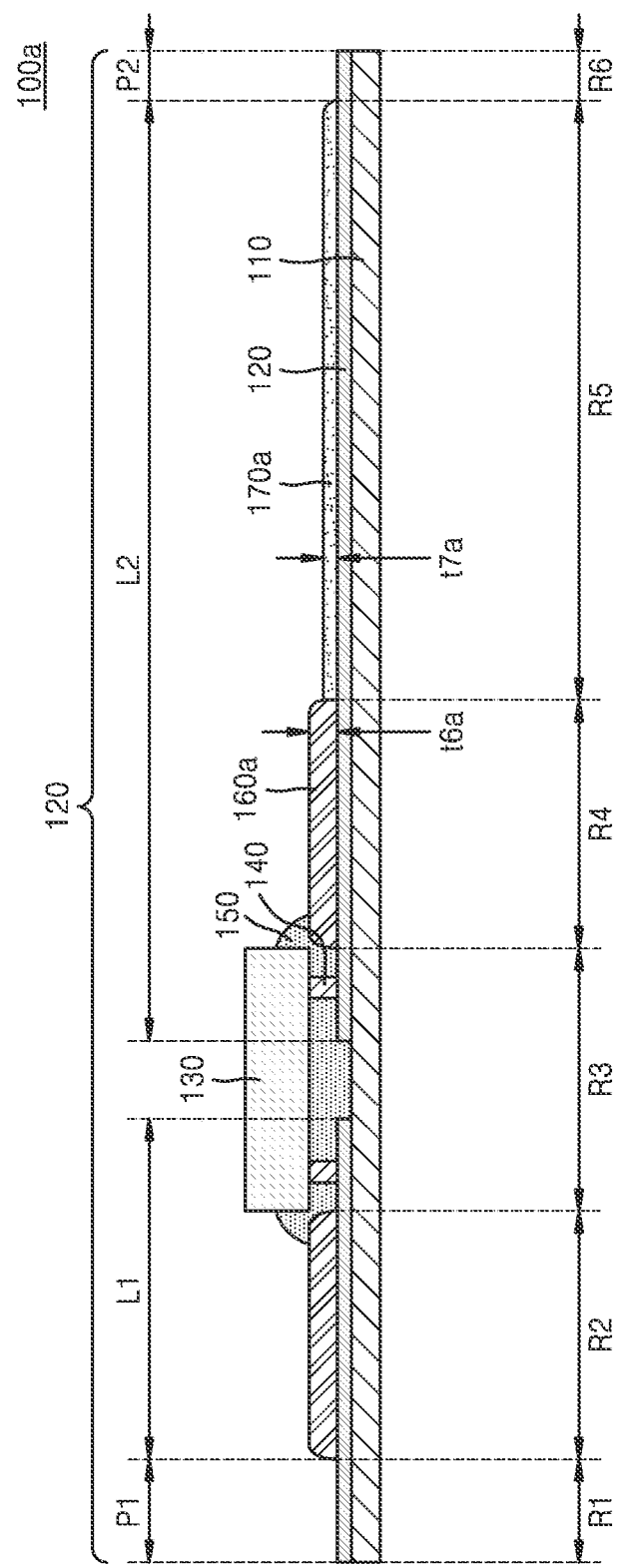

FIG. 3 is a cross-sectional view illustrating a COF package 100a according to embodiments of the inventive concept. Hereinafter, differences between the COF package 100 of FIG. 2 and the COF package 100a of FIG. 3 will be described.

Referring to FIG. 3, a thickness t6a of the first insulating layer 160a may be greater than a thickness t7a of the second insulating layer 170. In some embodiments, the thickness t6a of the first insulating layer 160a may be in a range of from about 15 μm to about 25 μm, and the thickness 17a of the second insulating layer 170a may be in a range of from about 5 μm to about 15 μm. Because an insulating layer is typically formed on the film 110 in the COF package to a thickness in a range of from about 10 μm to about 20 μm, the thickness t7a of the second insulating layer 170a may be (e.g.,) about 10 μm, whereas the thickness t6a of the first insulating layer 160a may be (e.g.,) about 20 μm. When the first insulating layer 160a is thicker than the second insulating layer 170a, the first insulating layer 160a having a relatively thicker thickness may prevent the film 110 from becoming damaged during the assembly and handling of the COF package 100, thereby facilitating the handling of the film 110. Yet, as will be described in some additional detail with reference to FIG. 11, the second insulating layer 170a having a relatively thinner thickness may facilitate bending of the bending area R5 of the film 110, thereby preventing the COF package 100a from becoming detached from a display panel even though the attachment length between the COF package 100a and the display panel is reduced.

In this regard, when the thickness t6a of the first insulating layer 160a is less than about 15 μm, it may be difficult to prevent damage to the film 110 during the assembly and handling of the COF package 100a. Yet, when the thickness t6a of the first insulating layer 160a is greater than about 25 μm, the overall thickness of the COF package 100a may increase too much. Further in this regard, when the thickness t7a of the second insulating layer 170a is greater than about 15 μm, it may be difficult to facilitate the bending of the bending area R5 of the film 110, and the COF package 100a may become detached from the display panel. Yet, when the thickness t7a of the second insulating layer 170a is less than about 5 μm, it may be difficult to properly form the second insulating layer 170a with a uniform thickness.

Figure 4:
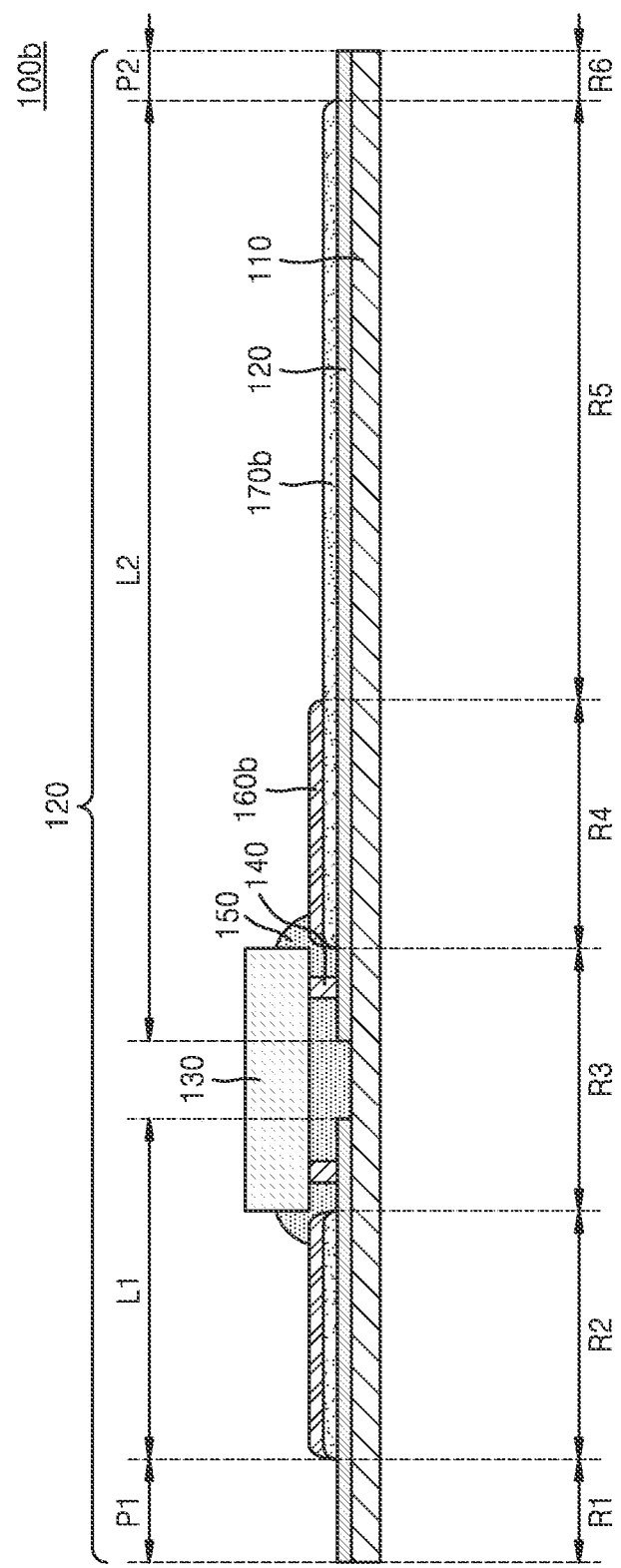

FIG. 4 is a cross-sectional view illustrating a COF package 100b according to embodiments of the inventive concept. Hereinafter, differences between the COF package 100 of FIG. 2 and the COF package 100b of FIG. 4 will be described.

Referring to FIG. 4, a second insulating layer 170b may further extend across portions of the conductive pattern layer 120 in the first reinforcement area R2 and/or the second reinforcement area R4 of the film 110. In some embodiments, the second insulating layer 170b may further extend under the entire length of the first insulating layer 160b. That is, the first insulating layer 160b may be disposed on a top surface of the second insulating layer 170b in the first reinforcement area R2 and/or the second reinforcement area R4, thereby reducing the flexibility of the film 110 in the first reinforcement area R2 and/or the second reinforcement area R4 to facilitate the assembly and handling of the COF package 100b, while maintaining a bendability in the bending area R5 sufficient to prevent detachment of the COF package 100b from a display panel.

Figure 5:
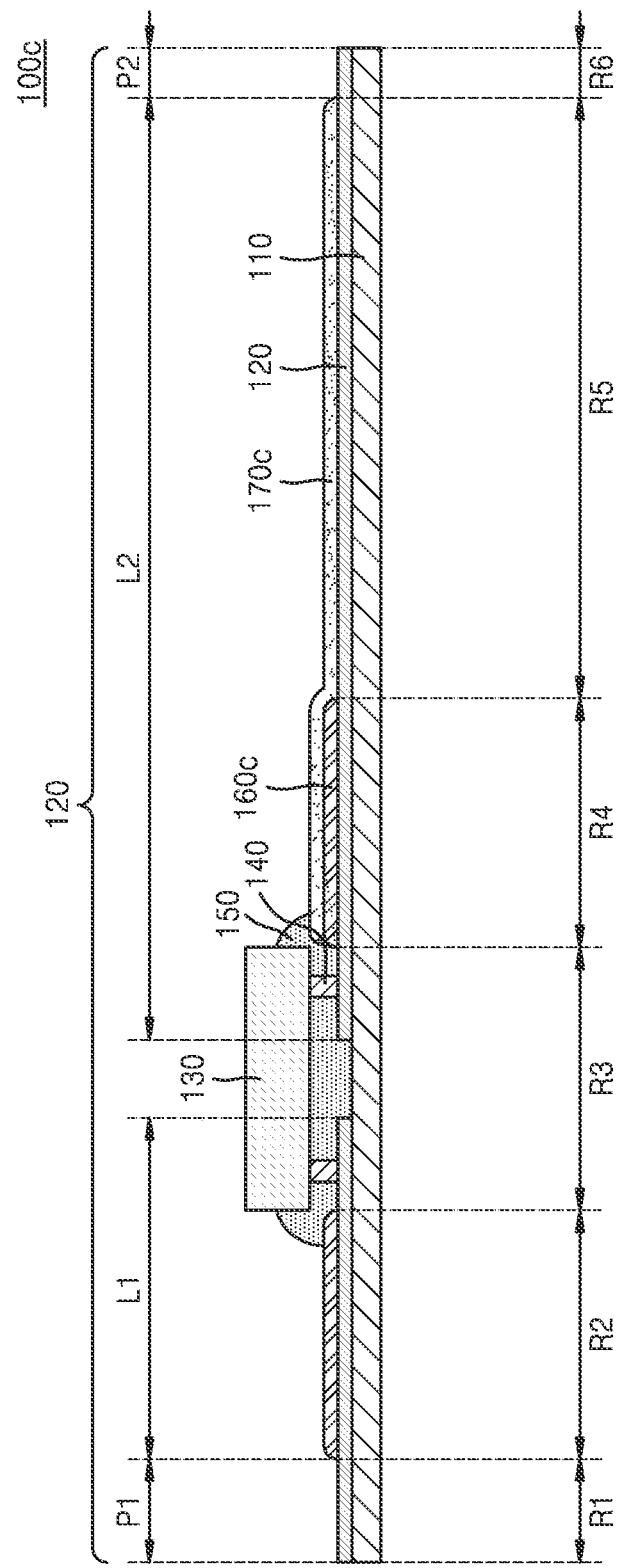

FIG. 5 is a cross-sectional view illustrating a COF package 100c according to embodiments of the inventive concept. Hereinafter, differences between the COF package 100 of FIG. 2 and the COF package 100c of FIG. 5 will be described.

Referring to FIG. 5, a second insulating layer 170c may extend further across the conductive pattern layer 120 into the first reinforcement area R2 and/or the second reinforcement area R4 of the film 110. In some embodiments, the second insulating layer 170c may further extend over a top surface of the first insulating layer 160c. That is, the first insulating layer 160c may extend between the conductive pattern layer 120 and a bottom surface of the second insulating layer 170c. Therefore, the first reinforcement area R2 and/or the second reinforcement area R4 of the film 110 may exhibit a flexibility sufficient to facilitate the assembly and handling of the COF package 100c while maintaining the bendability of the bending area R5 of the film 110 to prevent detachment of a display panel.

FIG. 6A is a cross-sectional view illustrating a COF package 200 according to embodiments of the inventive concept. Hereinafter, differences between the COF package 100 of FIG. 2 and the COF package 200 of FIG. 6A will be described.

Referring to FIG. 6A, the COF package 200 may include the film 110, as well as a first conductive pattern layer 120a disposed on a top surface of the film 110, a second conductive pattern layer 120b disposed on a bottom surface of the film 110 and connected to the first conductive pattern layer 120a by vias 190a to 190c penetrating the film 110. The COF package 200 also includes the chip 130 disposed on the first conductive pattern layer 120a, the first insulating layer 160 covering a portion of the first conductive pattern layer 120a adjacent to the chip 130, the second insulating layer 170 covering a portion of the first conductive pattern layer 120a spaced apart from the chip 130, and a third insulating layer 180 covering bottom surfaces of the film 110 and the second conductive pattern layer 120b.

The through vias 190a to 190c connecting the first conductive pattern layer 120a and the second conductive pattern layer 120b may include one or more conductive material(s) including, for example, copper (Cu), aluminum (Al), gold (Au), silver (Ag), titanium (Ti), and/or tungsten (W).

In some embodiments, the first insulating layer 160 may cover portions of the first conductive pattern layer 120a on top surfaces of the first reinforcement area R2 and the second reinforcement area R4. However, the first insulating layer 160 may expose the first conductive pads P1. In some embodiments, the second insulating layer 170 may cover portions of the first conductive pattern layer 120a on top surfaces of the bending area R5 and the second pad area R6 110. The third insulating layer 180 may cover portions of the second conductive pattern layer 120b on bottom surfaces of the first pad area R1, the first reinforcement area R2, the chip mounting area R3, the second reinforcement area R4, and the bending area R5. The third insulating layer 180 may further cover the bottom surface of the film 110. However, the third insulating layer 180 may expose the second conductive pad P2.

In some embodiments of the inventive concept, a third elastic modulus of the third insulating layer 180 may be less than the first elastic modulus of the first insulating layer, thereby facilitating the bendability of the bending area R5. For example, the third insulating layer 180 may include the same material(s) as the second insulating layer 170 (e.g., polyurethane). In some embodiments, a thickness 18 of the third insulating layer 180 may be in a range of from about 5 µm to about 15 µm. However, when the thickness 18 of the third insulating layer 180 is less than about 5 µm, the third insulating layer 180 may not be properly formed with a uniform thickness, and when the thickness 18 of the third insulating layer 180 is greater than about 15 µm, the bendability of the bending area R5 may be insufficient. In some embodiments, the thickness t8 of the third insulating layer 180 may be the same as the thickness t7 of the second insulating layer 170. For example, both the thickness 18 of the third insulating layer 180 and the thickness 17 of the second insulating layer 170 may be (e.g.,) about 10 µm. The thickness t8 of the third insulating layer 180 may be equal to or less than the thickness t6 of the first insulating layer 160.

Figure 6B:
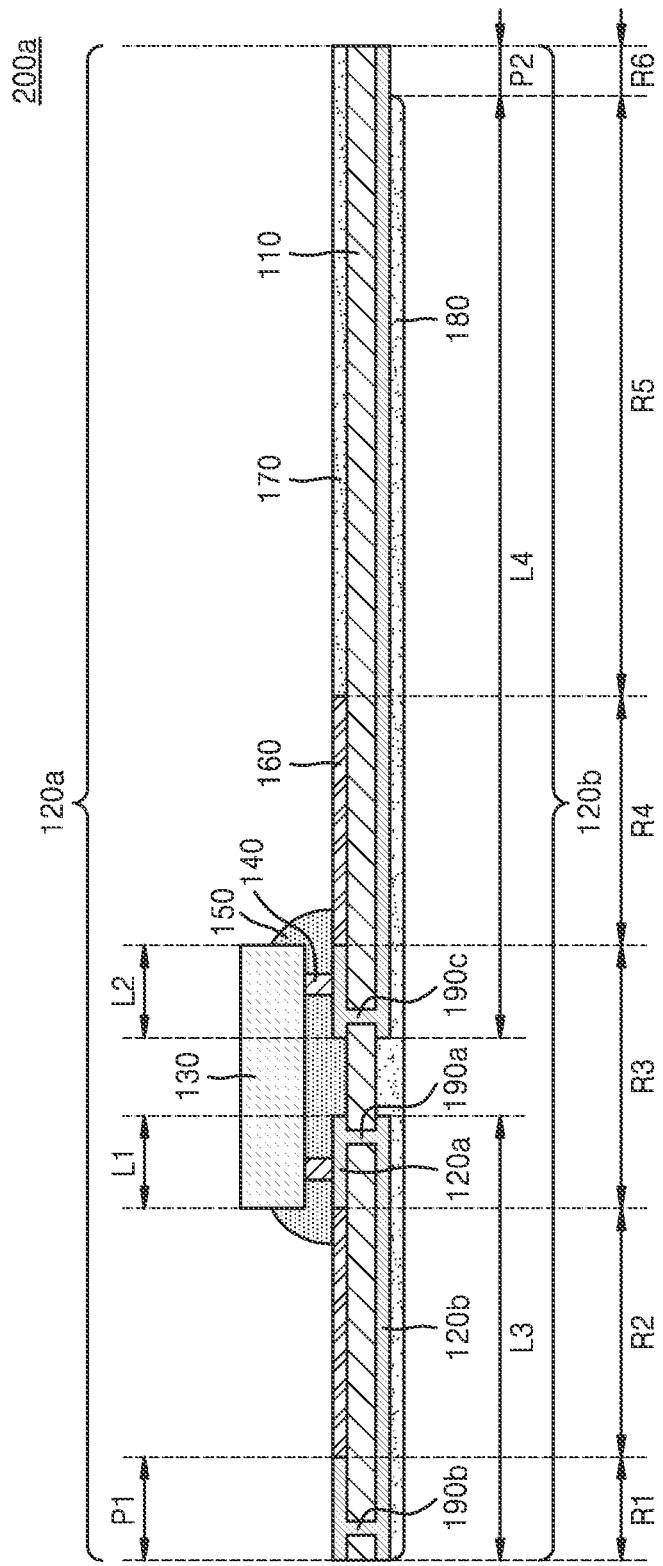

FIG. 6B is a cross-sectional view illustrating a COF package 200a according to embodiments of the inventive concept. Hereinafter, differences between the COF package 100 of FIG. 2 and the COF package 200a of FIG. 6B will be described.

Referring to FIG. 6B, the first conductive pattern layer 120a may include, for example, a first conductive pad P1 disposed on a top surface of the first pad area R1, as well as a first conductive lines L1 and a second conductive lines L2 extending on a top surface of the chip mounting area R3 of the film 110. The first conductive line L1 and the second conductive line L2 may be connected to the chip 130 through respective conductive bumps 140. Here, the second conductive pattern layer 120b may include, for example, a second conductive pad P2 disposed on a bottom surface of the second pad area R6 of the film 110. In some embodiments, the second conductive pattern layer 120b may further include a fourth conductive line L4 that connects the second conductive pad P2 of the second conductive pattern layer 120b with the second conductive line L2 of the first conductive pattern layer 120a. In some embodiments, the second conductive pattern layer 120b may further include a third conductive line L3 that connects the first conductive pad P1 of the first conductive pattern layer 120a.

The first conductive line L1 may be electrically connected to the first conductive pad P1. In some embodiments, the first conductive line L1 may be electrically connected to the first conductive pad P1 using the first through via 190a, and the third conductive line L3 of the second conductive pattern layer 120b using the second through via 190b. In another embodiment, the first conductive line L1 may be directly connected to the first conductive pad P1 and extend further on the top surface of the first reinforcement area R2, without going through the second conductive pattern layer 120b and through vias 190a and 190b.

The second conductive line L2 may be electrically connected to the second conductive pad P2. In some embodiments, the second conductive line L2 may be connected to the second conductive pad P2 of the second conductive pattern layer 120b, through the third through via 190c and the fourth conductive line L4 of the second conductive pattern layer 120b. Alternately, in some embodiments in which the second conductive line L2 extends further on the second reinforcement area R4 of the film 110, the bending area R5, and the second pad area R6 and the third through via 190c penetrates in the second pad area R6 of the film 110, the second conductive line L2 may be connected to the second conductive pad P2 through only the third through via 190c, not through the fourth conductive line L4.

The first conductive pattern layer 120a and the second conductive pattern layer 120b may be connected to each other using the through vias 190a to 190c. For example, the first through via 190a may connect between the first conductive line L1 of the first conductive pattern layer 120a and the third conductive line L3 of the second conductive pattern layer 120b. In addition, the second through via 190b may connect between the third conductive line L3 of the second conductive pattern layer 120b and the first conductive pad P1 of the first conductive pattern layer 120a. In addition, the third through via 190c may connect between the second conductive line L2 of the first conductive pattern layer 120a and the fourth conductive line L4 of the second conductive pattern layer 120b.

Although FIG. 6B shows the first through via 190a being disposed within the chip mounting area R3, in some embodiments, the first through via 190a may be disposed within the first reinforcement area R2 of the film 110. In these embodiments, the first conductive line L1 may further extend to the first reinforcement area R2. In addition, although FIG. 6 shows that the second through via 190b being disposed within the first pad area R1 of the film 110, in some embodiments, the second through via 190b may be disposed within the first reinforcement area R2. In these embodiments, the first conductive pattern layer 120a may further include a fifth conductive line that may be positioned on the top surface of the first reinforcement area R2 of the film 110 and may connect the first conductive pad P1 and the second through via 190b.

Also, FIG. 6B shows the third through via 190c being disposed in the chip mounting area R3, and the second conductive line L2 extending only to the top surface of the chip mounting area R3. Alternately in other embodiments, the third through via 190c may be disposed within the second reinforcement area R4. In such embodiments, the second conductive line L2 may further extend to the top surface of the second reinforcement area R4. Alternately, the third through via 190c may be disposed within the bending area R5. In such embodiments, the second conductive line L2 may further extend to the top surface of the bending area R5. Alternately, the third through via 190c may be disposed within the second pad area R6. In such embodiments, the second conductive line L2 may further extend to the top surface of the second pad area R6, and the second conductive line L2 may be connected to the second conductive pad P2 through the third through via 190c and not through the fourth conductive line L4.

In some embodiments, the first insulating layer 160 may cover the top surfaces of the first reinforcement area R2 and the second reinforcement area R4 of the film 110. In some embodiments, the first insulating layer 160 may further cover the first conductive pattern layer 120a. However, the first insulating layer 160 may expose the first conductive pad P1. In some embodiments, the second insulating layer 170 may cover the top surfaces of the bending area R5 and the second pad area R6 of the film 110. In some embodiments, the second insulating layer 170 may further cover the first conductive pattern layer 120a. The third insulating layer 180 may cover bottom surfaces of the first pad area R1, the first reinforcement area R2, the chip mounting area R3, the second reinforcement area R4 of the film 110, and the bottom surface of the second conductive pattern layers 120b. However, the third insulating layer 180 may expose the second conductive pad P2.

Figure 7A:
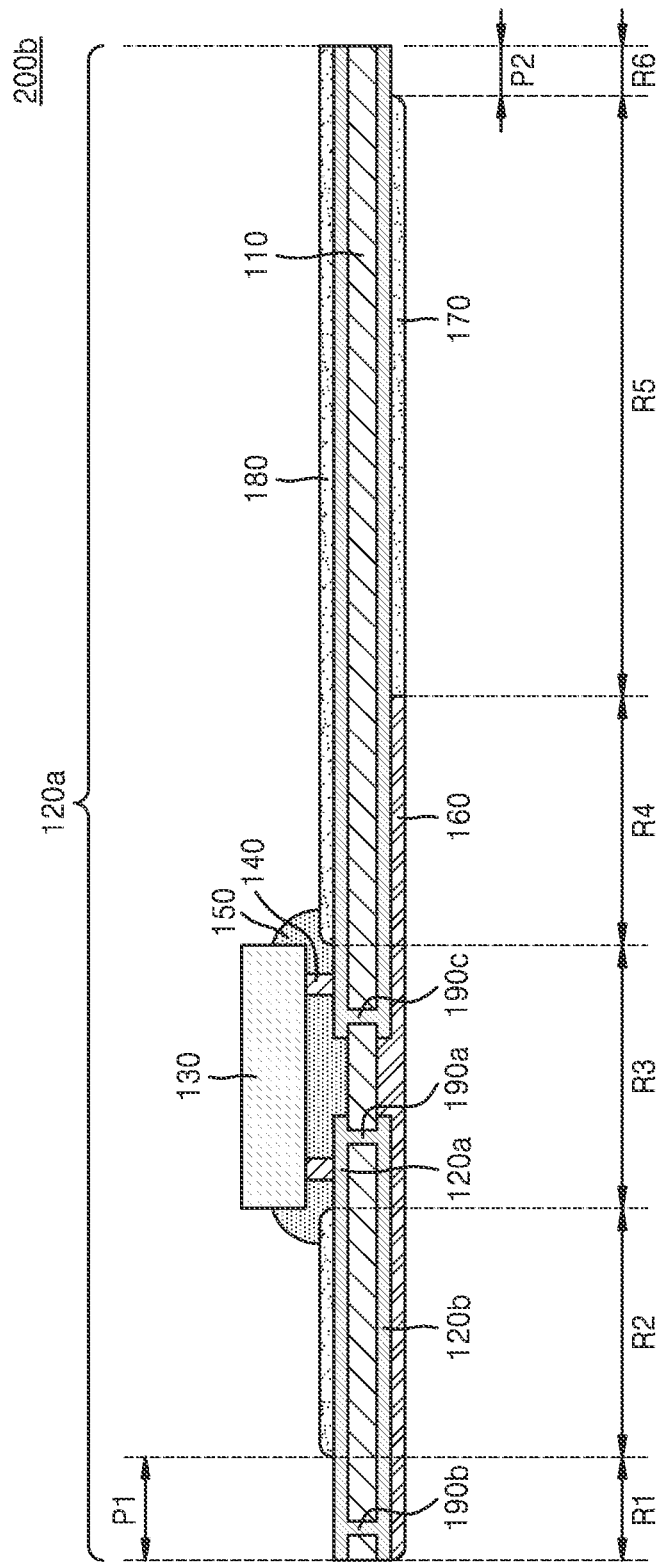

FIG. 7A is a cross-sectional view illustrating a COF package 200b according to embodiments of the inventive concept. Hereinafter, differences between the COF package 200 of FIG. 6A and the COF package 200b of FIG. 7A will be described.

Referring to FIG. 7A, the first insulating layer 160 and the second insulating layer 170 may cover the bottom surface of the film 110 and the second conductive pattern layer 120b, while the third insulating layer 180 may cover the first conductive pattern layer 120a. However, the second insulating layer 170 may expose the second conductive pad P2, and the third insulating layer 180 may expose the first conductive pad P1.

Certain embodiments of the inventive concept may incorporate aspects of the COF package 200 and the COF package 200b. That is, the first insulating layer 160 may cover not only a portion of the first conductive pattern layer 120a on the top surfaces of the first reinforcement area R2 and the second reinforcement area R4, but also a bottom surface of the chip mounting area R3 and a portion of the second conductive pattern layer 120b on the bottom surface of the first pad area R1, the first reinforcement area R2, the chip mounting area R3, and the second reinforcement area R4. The second insulating layer 170 may cover not only portions of the first conductive pattern layer 120a on the top surfaces of the bending area R5 and the second pad area R6, but also a portion of the second conductive pattern layer 120b on the bottom surface of the bending area R5. However, the first insulating layer 160 may still expose the first conductive pad P1, and the second insulating layer 170 may expose the second conductive pad P2.

Figure 7B:
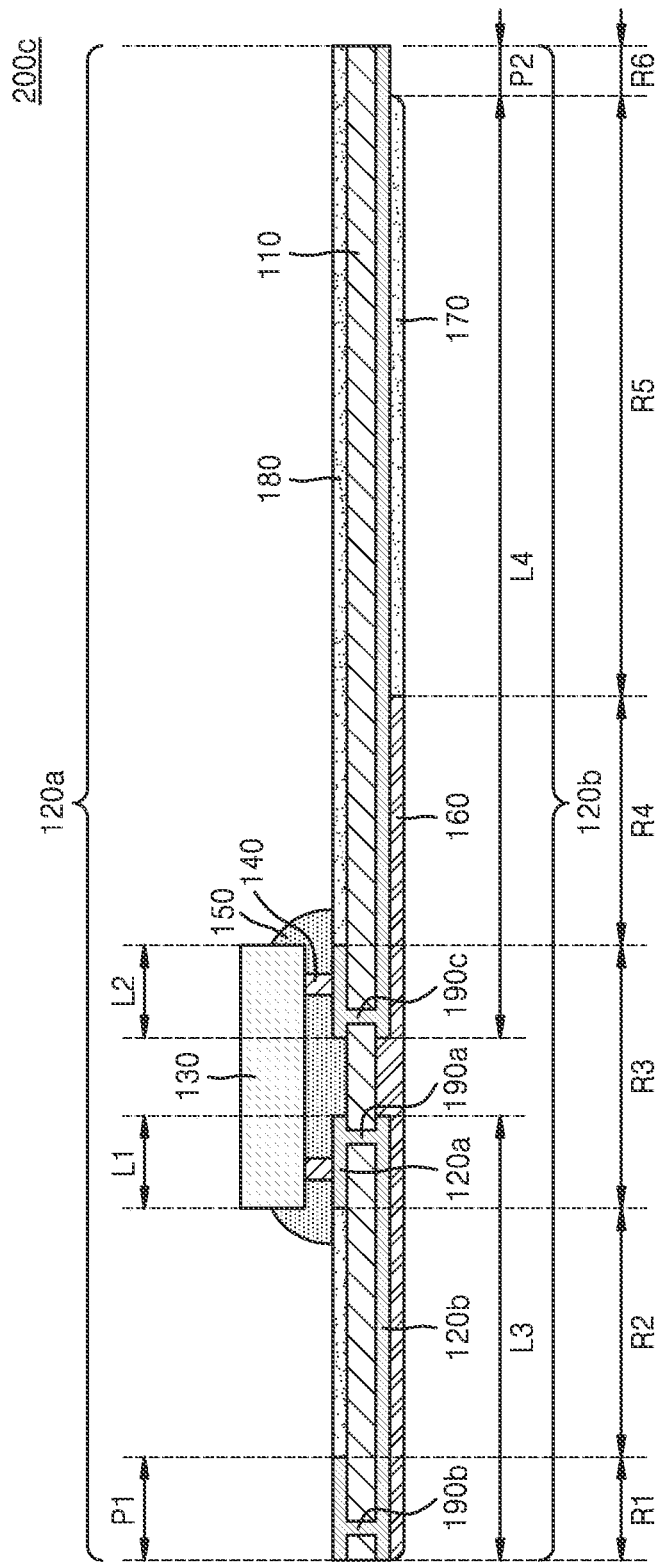

FIG. 7B is a cross-sectional view illustrating a COF package 200c according to embodiments of the inventive concept. Hereinafter, differences between the COF package 200a of FIG. 6B and the COF package 200c of FIG. 7B will be described.

Referring to FIG. 7B, the first insulating layer 160 and the second insulating layer 170 may cover the second conductive pattern layer 120b, while the third insulating layer 180 may cover the first conductive pattern layer 120a. For example, the first insulating layer 160 may cover portions of the second conductive pattern layer 120b on the bottom surfaces of the first pad area R1, the first reinforcement area R2, the chip mounting area R3, and the second reinforcement area R4. In some embodiments, the second insulating layer 170 may cover a portion of the second conductive pattern layer 120b on the bottom surface of the bending area R5. However, the second insulating layer 170 may expose the second conductive pad P2. In some embodiments, the third insulating layer 180 may cover the top surfaces of the first reinforcement area R2, the second reinforcement area R4, the bending area R5, and the second pad area R6. In some embodiments, the third insulating layer 180 may further cover the first conductive pattern layer 120a. However, the third insulating layer 180 may expose the first conductive pad P1.

In certain aspects of the inventive concept, aspects of the COF package 200a and the COF package 200c may be combined. That is, the first insulating layer 160 may cover portions of the second conductive pattern layer 120b not only on the top surfaces of the first reinforcement area R2 and the second reinforcement area R4, but also on the bottom surfaces the first pad area R1, the first reinforcement area R2, the chip mounting area R3, and the second reinforcement area R4 of the film 110. The second insulating layer 170 may cover portions of the second conductive pattern layer 120b on the bottom surfaces of the bending area R5 of the film 110 as well as the bending area R5 and the second pad area R6. However, the first insulating layer 160 may still expose the first conductive pad P1, and the second insulating layer 170 may expose the second conductive pad P2.

Figure 8:
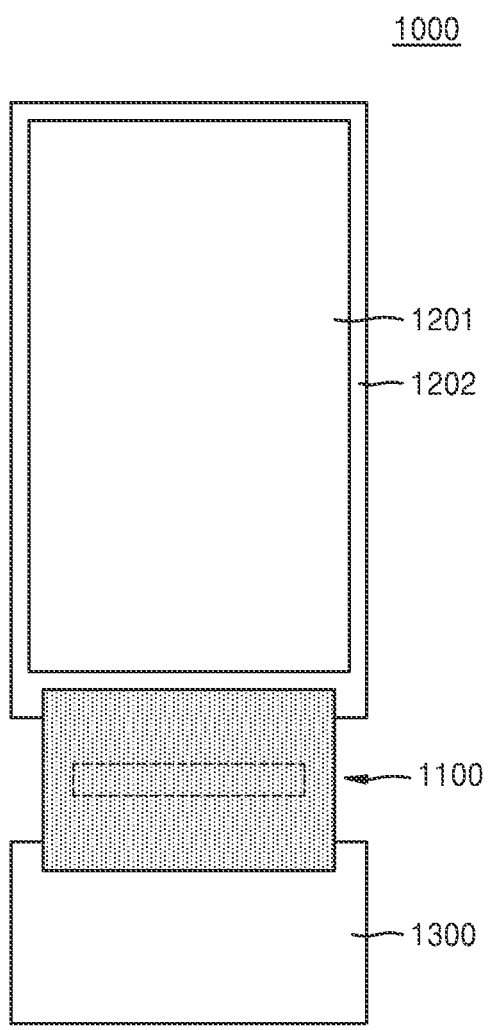
FIGS. 8 and 9 are plan views respectively illustrating display modules according to embodiments of the inventive concept.

FIG. 8 is a plan view illustrating a display module 1000 according to embodiments of the inventive concept.

Referring to FIG. 8, the display module 1000 may include a COF package 1100, a display panel 1202 connected to one end of the COF package 1100, and a circuit board 1300 connected to the other end of the COF package 1100. In some embodiments, the display module 1000 may further include a protective layer 1201 on a top surface of the display panel 1202. In some embodiments, the display module 1000 may further include a touch panel between the display panel 1202 and the protective layer 1201.

The COF package 1100 may include one of the COF packages 100, 100a, 100b, 100c, 200, 200a, 200b, and 200c according to the embodiments described with reference to FIGS. 1 to 7B. The second conductive pads P2 of the COF package 1100 (see FIGS. 1 to 7B) may be attached to and connected to the top surface of the display panel 1202. The first conductive pads P1 of the COF package 1100 (see FIGS. 1 to 7B) may be attached to and connected to the circuit board 1300.

The display panel 1202 may include any type of display panel including a liquid crystal display panel and an organic light emitting diode panel. In some embodiments in which the display panel 1202 is the liquid crystal display panel, the display panel 1202 may include a thin film transistor substrate and a color filter substrate facing each other, and a liquid crystal may be injected between the thin film transistor substrate and the color filter substrate. The display panel 1202 may display an image by adjusting the light transmittance of the liquid crystal by using a thin film transistor as a switching element. In some embodiments, a backlight assembly may be further provided to supply light to the display panel 1202. In some embodiments in which the display panel 1202 is an organic light emitting diode panel, the display panel 1202 may include a passive-matrix type or an active-matrix type organic light emitting diode panel.

The circuit board 1300 may include a printed circuit board (PCB). The circuit board 1300 may include a rigid PCB or a flexible printed circuit board (FPCB). The circuit board 1300 may receive various signals from an external circuit and output various control signals. The COF package 1100 may output a driving signal driving the display panel 1202 in response to a control signal input from the circuit board 1300. The display panel 1202 may display the image in response to the driving signal input from the COF package 1100.

The protective layer 1201 may protect the display panel 1202 from physical and/or chemical environments. The touch panel may be between the display panel 1202 and the protective layer 1201. The touch panel may include one or more touch sensing devices, wherein the touch sensing devices may include a touch driving electrodes and a conductive matrix. A touch driving unit may be disposed at one end of the touch panel. The touch driving unit may include a touch panel chip controlling the touch panel and a touch panel connection unit connecting the touch panel chip to the touch panel.

Figure 9:
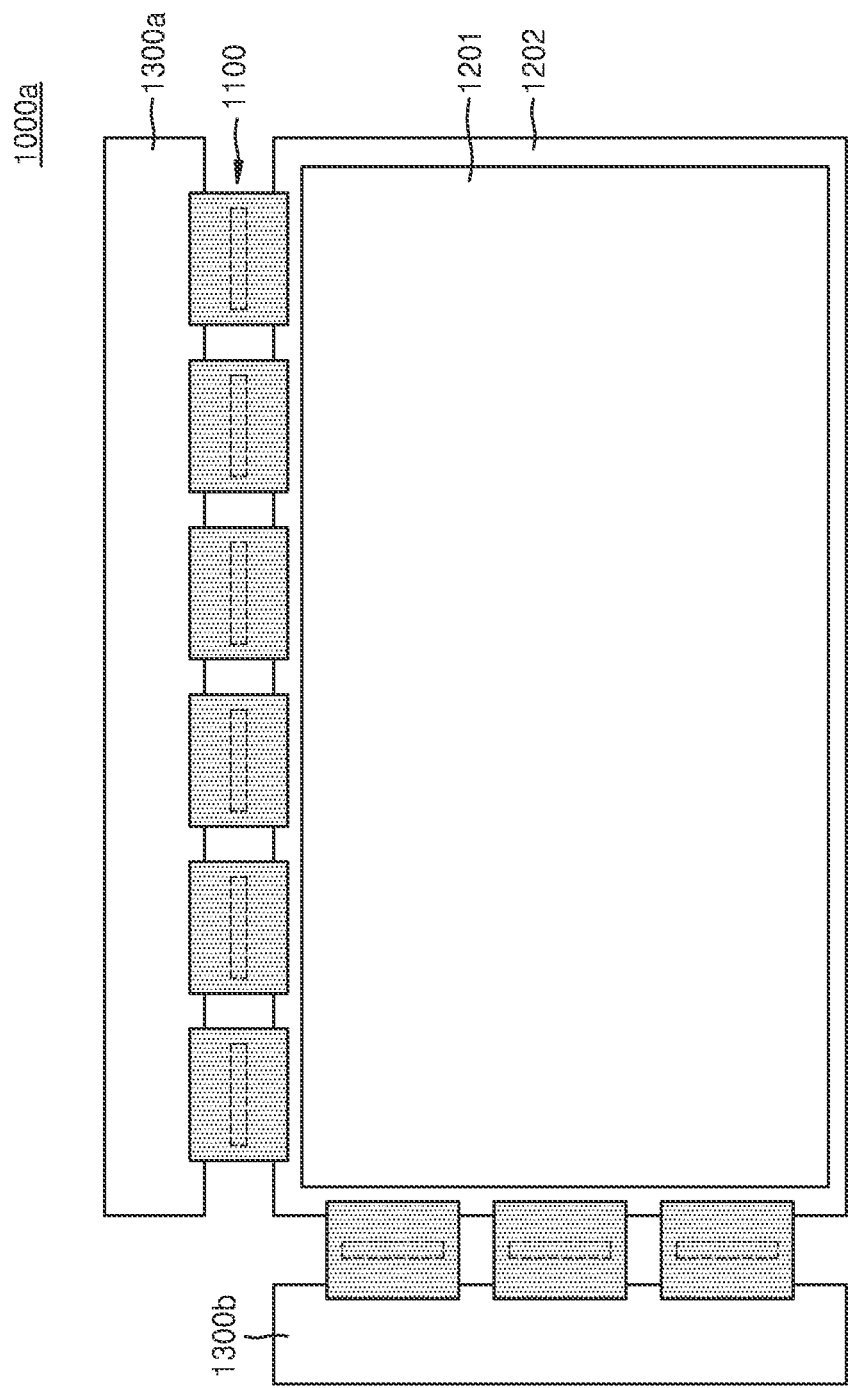

FIG. 9 is a plan view illustrating a display module 1000a according to embodiments of the inventive concept. Hereinafter, differences between the display module 1000 of FIG. 8 and the display module 1000a of FIG. 9 will be described.

Referring to FIG. 9, when the display panel 1202 is relatively large, multiple COF packages 1100 may be attached to and connected to the display panel 1202. In some embodiments, the COF packages 1100 may be connected to a first circuit board 1300a, and other COF packages 1100 may be connected to a second circuit board 1300b. In FIG. 9, six (6) COF packages 1100 are connected to the first circuit board 1300a, and three (3) COF packages 110 are connected to the second circuit board 1300b, but the number of circuit boards and/or respectively connected COF packages 1100 may vary by design.

Figure 10:
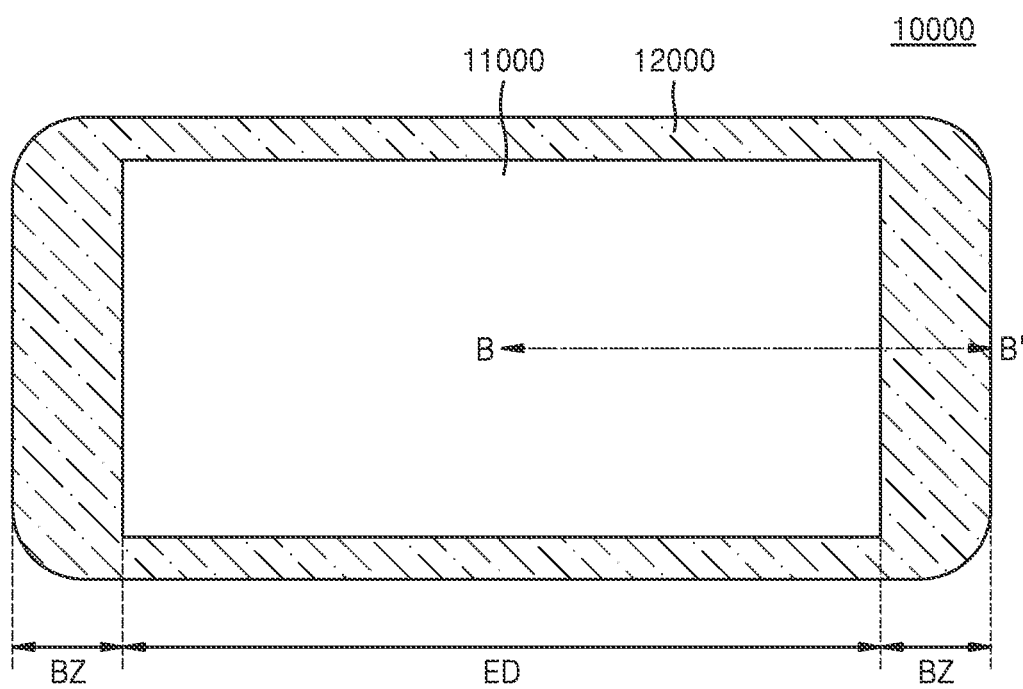
FIG. 10 is a plan view illustrating an electronic device according to embodiments of the inventive concept.

FIG. 10 is a plan view illustrating an electronic device 10000 according to embodiments of the inventive concept, and FIG. 11 is a cross-sectional view further illustrating the electronic device 10000 taken along the line B-B' in FIG. 10.

Referring to FIGS. 10 and 11, the electronic device 10000 may vary in design and functionality. For example, the electronic device 10000 may be a portable electronic device such as a smart phone or a tablet, a wearable electronic device such as a smart glass or a smart watch, or a home appliance such as a refrigerator, a television, a monitor, a notebook computer, and a vacuum cleaner. The electronic device 10000 may generally include a housing 12000 and a display module 11000 associated with the housing 12000.

The housing 12000 may accommodate the display module 11000 and other electronic components, such as a circuit board, a battery, a memory, a processor, an infrared sensor, a fingerprint sensor, a gyro sensor, a camera, and a speaker. In FIGS. 10 and 11, the housing 12000 is illustrated as being integrally formed, but the housing 12000 may be formed by assembling a plurality of parts. For example, the housing 12000 may be formed by a rear portion, a front portion, and a side wall portion between the rear portion and the front portion, or by the front portion and a remaining portion having a bottom and a side wall. The housing 12000 may have a window through which the display module 11000 is exposed. A front surface of the housing 12000 may include a window area ED where the display module 11000 is exposed and a bezel area BZ around the window area ED.

The display module 11000 may include (e.g.,) one or more display module(s) 1000 and 1000a described with reference to FIGS. 8 and 9. The COF package 1100 may include one of the COF packages 100, 100a, 100b, and 100c according to the embodiments illustrated in FIGS. 1 to 5. In the display modules 1000 and 1000a, the first conductive pads P1 may be attached to the circuit board 1300, and the second conductive pads P2 may be attached to a top surface of the display panel 1202. The display module 11000 may include a first adhesive portion AH1 that attaches the first conductive pads P1 to the circuit board 1300 and a second adhesive portion AH2 that attaches the second conductive pads P2 to the top surface of the display panel 1202. In some embodiments, the second adhesive portion AH2 may further contact the second conductive pad P2 as well as a portion of the second insulating layer 170. In some embodiments, the first adhesive portion AH1 and the second adhesive portion AH2 may include an anisotropic conductive film. The anisotropic conductive film may include conductive particles serving as an electrical passage and an insulating material fixing the conductive particles.

The second pad area R6 and the bending area R5 of the film 110 may be disposed in the bezel area BZ of the housing 12000. The first pad area R1, the first reinforcement area R2, the chip mounting area R3, and the second reinforcement area R4 of the film 110 may be disposed within the window area ED. The bending area R5 of the film 110 may be bent such that the second conductive pad P2 may be attached to the top surface of the display panel 1202 and the chip 130 is disposed between the chip mounting area R3 of the film 110 and the bottom surface of the display panel 1202. A bending radius r1 of the bending area R5 of the film 110 may be in a range of from about 200 μm to about 800 μm (e.g., about 400 μm). When the bending radius r1 of the bending area R5 is greater than about 800 μm, a length of the bezel area BZ may be too long, and when the bending radius r1 of the bending area R5 of the film 110 is less than about 200 μm, the COF package 1100 may become detached from the display panel 1202.

In order to reduce the length of the bezel area BZ of the housing 12000, the attachment length d2 between the display panel 1202 and the COF package 1100 may be reduced. In some embodiments, the attachment length d2 may be in a range of from about 200 μm to about 600 μm. When the attachment length d2 is greater than 600 μm, the length of the bezel area BZ becomes too long, and when the attachment length d2 is 200 μm or less, the COF package 1100 may become detached from the display panel 1202 due to weak adhesion and excessive elasticity. For example, the attachment length d2 between the display panel 1202 and the COF package 1100 may be about 400 μm, which is less than half of the comparative, conventional example having (e.g.,) a length of about 850 μm.

According to the inventive concept, a first elastic modulus of the first insulating layer 160 may be greater than a second elastic modulus of the second insulating layer 170. Therefore, even though the thickness of the film 110 is relatively very thin, the risk of damage to the film 110 during the assembly and handling of the COF package 1100 is greatly reduced. In addition, even though the attachment length d2 between the COF package 1100 and the display panel 1202 is reduced due to the second insulating layer 170 having a relatively low elastic modulus and the film 110 having a reduced thickness, the COF package 1100 will not become detached from the display panel 1202. Accordingly, the electronic device 10000 having a bezel area BZ of reduced length may be provided. In addition, the first insulating layer 160 may exhibit a higher resistance to cleaning solutions (e.g., glass cleaner) as compared with materials previously used as an insulating layer in the COF package 1100 (e.g., polyurethane). Accordingly, the reliability of the COF package 1100, the display module 11000, and the electronic device 10000 including the same may be improved.

Figure 12A:
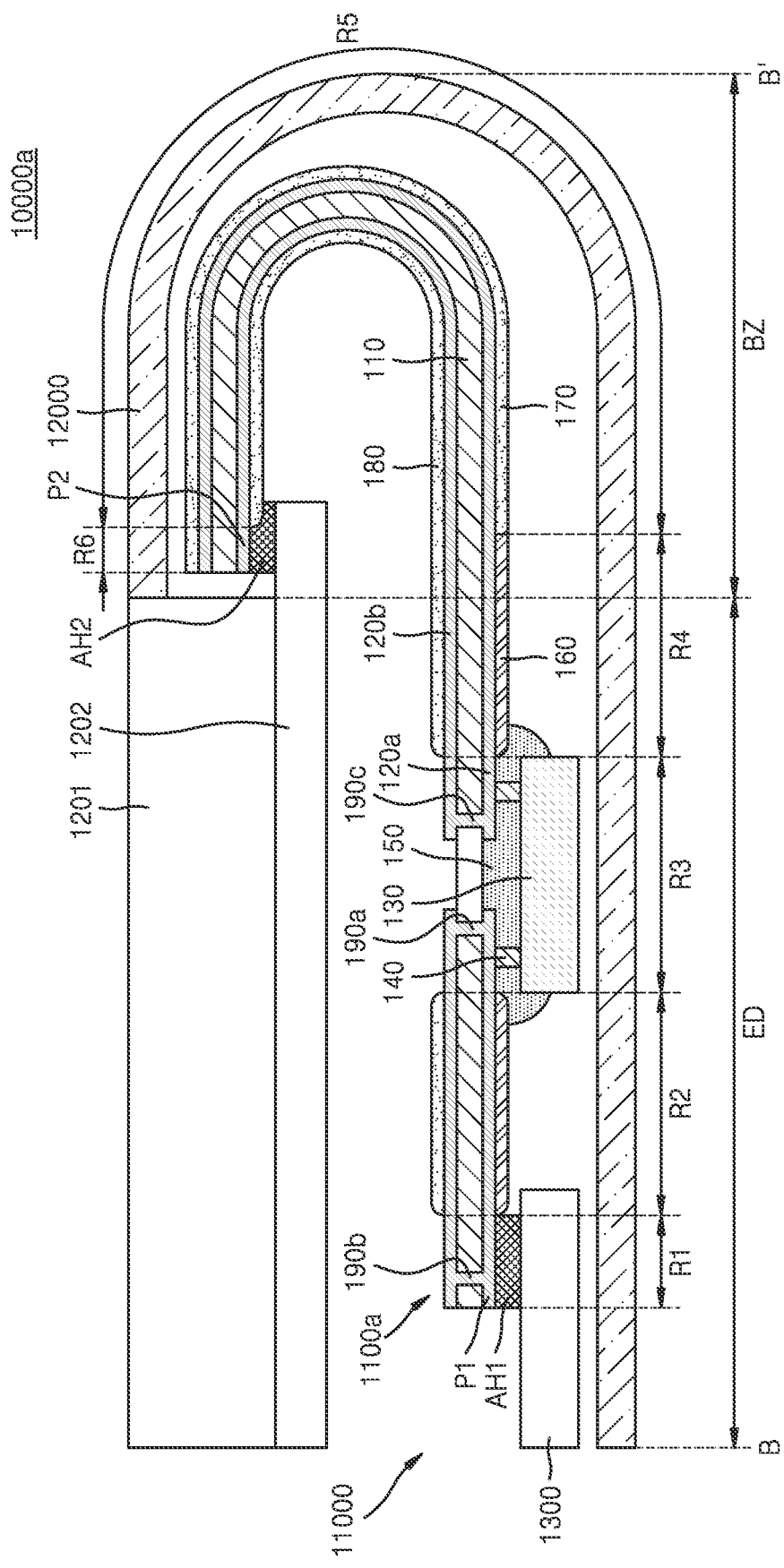
FIGS. 12A and 12B are cross-sectional views respectively illustrating an electronic device according to embodiments of the inventive concept.
Figure 12B:
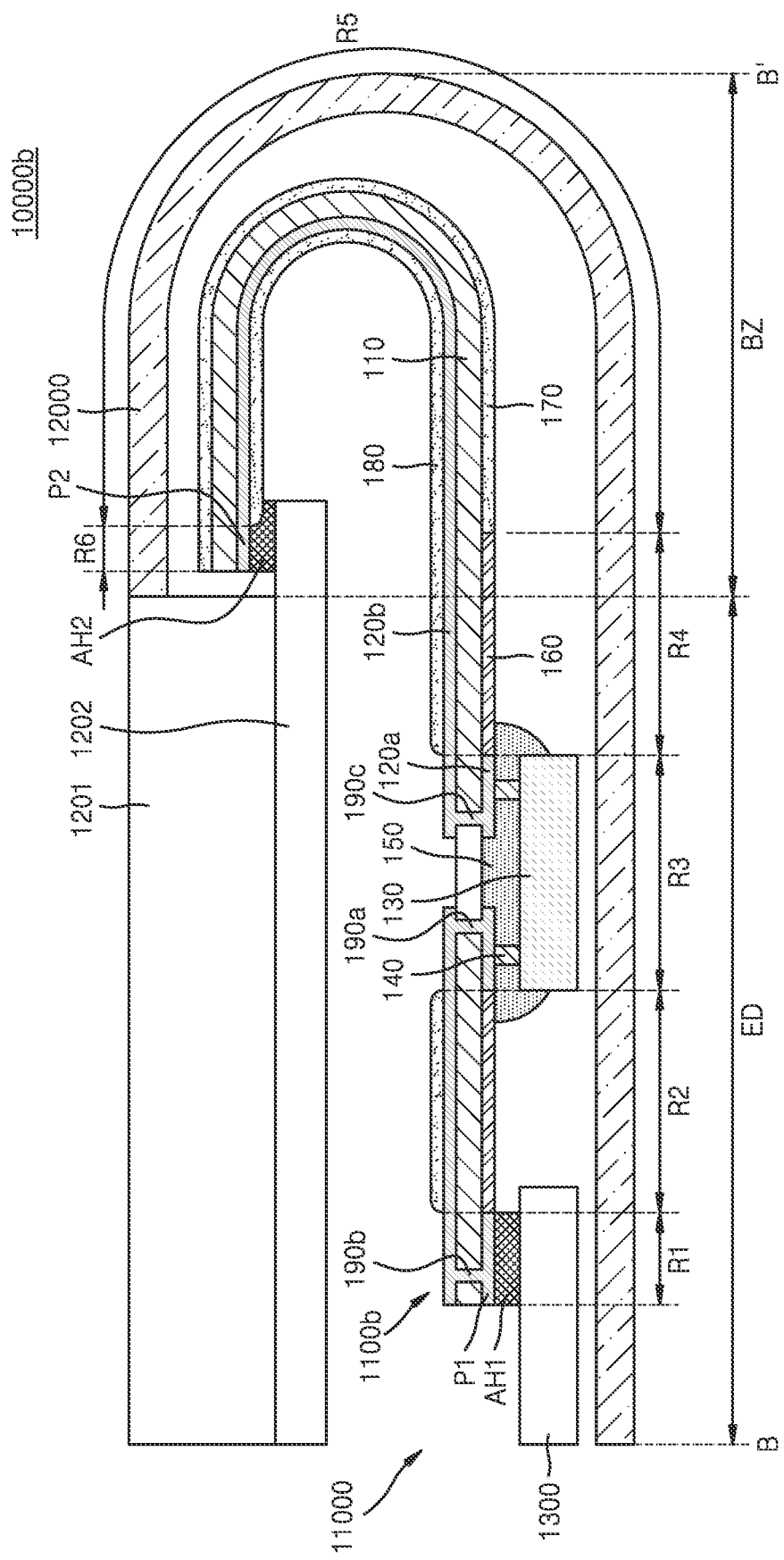

FIG. 12A is a cross-sectional view illustrating an electronic device 10000a according to embodiments of the inventive concept, and FIG. 12B is a cross-sectional view illustrating an electronic device 10000b according to embodiments of the inventive concept. Hereinafter, differences between the electronic device 10000 of FIG. 11, the electronic device 10000a of FIG. 12A, and the electronic device 10000b of FIG. 12B will be described.

Referring to FIGS. 12A and 12B, the COF package 1100a (and/or the COF package 1100b of FIG. 12B) may include at least one COF package according to embodiments of the inventive concept (e.g., the COF package 200 of 6A and/or the COF package 200b of FIG. 7A.

In some embodiments, the display panel 1202 may be attached to the second conductive pad P2 of the second conductive pattern layer 120b, and the circuit board 1300 may be attached to the first conductive pad P1 of the first conductive pattern layer 120a. The bending area R5 of the film 110 may be bent such that the second conductive pattern layer 120b is attached to the top surface of the display panel 1202, the first conductive pattern layer 120a is attached to the circuit board 1300, and the chip mounting area R3 of the film 110 is disposed between the chip 130 and the display panel 1202.

While the inventive concept has been particularly shown and described with reference to embodiments thereof, it will be understood that various changes in form and details may be made therein without departing from the spirit and scope of the following claims.

What is claimed is:

1. A chip-on-film (COF) package comprising:
   a film including a reinforcement area, a bending area, and a chip mounting area, wherein the reinforcement area is between the chip mounting area and the bending area;
   a conductive pattern layer disposed on the film in the reinforcement area, in the bending area, and at in the chip mounting area;
   a chip mounted on a portion of the conductive pattern layer in the chip mounting area;
   a first insulating layer having a first elastic modulus and extending over the conductive pattern layer in the reinforcement area, wherein a portion of the first insulating layer closest to the bending area terminates outside the bending area; and
   a second insulating layer having a second elastic modulus and extending over the conductive pattern layer in the bending area and reinforcement area,
   wherein the first elastic modulus is greater than the second elastic modulus, and the first elastic modulus is in a range of from about 5 GPa to about 20 GPa, and the second elastic modulus is in a range of from about 0.5 GPa to about 2 GPa, and
   wherein the second insulating layer is positioned between the conductive pattern layer and the first insulating layer.

2. The COF package of claim 1, wherein the film is intact in the chip mounting area.

3. The COF package of claim 1, wherein a top surface of the second insulating layer in the bending area is exposed from the first insulating layer.

4. The COF package of claim 1, wherein a thickness of the film is a range of from about 10 µm to about 30 µm.

5. The COF package of claim 1, wherein the first insulating layer includes polyimide, and the second insulating layer includes polyurethane.

6. The COF package of claim 1, wherein a thickness of the first insulating layer is greater than a thickness of the second insulating layer.

7. The COF package of claim 6, wherein the thickness of the first insulating layer is in a range of from about 15 µm to about 25 µm, and the thickness of the second insulating layer is in a range of from about 5 µm to about 15 µm.

8. The COF package of claim 1, wherein the conductive pattern layer further comprises a first pad disposed on a first pad area.

9. The COF package of claim 8, where in the first pad is exposed from the second insulating layer.

10. A chip-on-film (COF) package comprising:
    a film including a first pad area at one end of the film, a second pad area at another end of the film, a chip mounting area between the first pad area and the second pad area, a first reinforcement area between the chip mounting area and the first pad area, a second reinforcement area between the chip mounting area and the second pad area, and a bending area between the second reinforcement area and the second pad area;
    first conductive pads disposed on the first pad area;
    second conductive pads disposed on the second pad area;
    first conductive lines extending from the chip mounting area through the first reinforcement area and respectively connected to the first conductive pads;
    second conductive lines extending from the chip mounting area through the second reinforcement area and the bending area and respectively connected to second conductive pads;
    a chip mounted on portions of the first conductive lines and portions of the second conductive lines in the chip mounting area;
    conductive bumps disposed between the first conductive lines and the chip and between the second conductive lines and the chip;
    a sealing part covering a top surface of the chip mounting area and at least partially surrounding the conductive bumps;
    a first insulating layer having a first elastic modulus, exposing the first conductive pads, and covering the first conductive lines in the first reinforcement area and the second conductive lines in the second reinforcement area, wherein a portion of the first insulating layer closest to the bending area terminates outside the bending area; and
    a second insulating layer having a second elastic modulus, exposing the second conductive pads, and covering the second conductive lines in the bending area and second reinforcement area,
    the first and second insulating layers disposed on upper surfaces of the second conductive lines, and
    wherein the first elastic modulus is greater than the second elastic modulus, and the first elastic modulus is in a range of from about 5 GPa to about 20 GPa, and the second elastic modulus is in a range of from about 0.5 GPa to about 2 GPa,
    wherein the first insulating layer is on the second insulating layer in the second reinforcement area.

11. The COF package of claim 10, wherein the sealing part does not contact a bottom surface of the film in the chip mounting area.

12. The COF package of claim 10, wherein a top surface of the second insulating layer in the bending area is exposed from the first insulating layer.

13. The COF package of claim 10, wherein the first insulating layer includes polyimide, and the second insulating layer includes polyurethane.

14. The COF package of claim 10, wherein a thickness of the first insulating layer is greater than a thickness of the second insulating layer.

15. The COF package of claim 14, wherein the thickness of the first insulating layer is in a range of from about 15 µm to about 25 µm, and the thickness of the second insulating layer is in a range of from about 5 µm to about 15 µm.

16. A chip-on-film (COF) package comprising:
    a film;
    a first conductive pattern layer disposed on a top surface of the film;
    a second conductive pattern layer disposed on a bottom surface of the film;
    a through via penetrating the film and connecting the first conductive pattern layer and the second conductive pattern layer;
    a chip mounted on the first conductive pattern layer;
    a first insulating layer having a first elastic modulus and covering at least a portion of the top surface adjacent to the chip, wherein the first insulating layer is spaced apart from the chip;

a second insulating layer having a second elastic modulus and covering at least a portion of the top surface spaced apart from the chip; and a third insulating layer having a third elastic modulus covering at least a portion of the bottom surface, wherein the first elastic modulus is greater than the second elastic modulus, wherein the first and second insulating layers are disposed on a common upper surface of the first conductive pattern layer and are laterally adjacent each other.

17. The COF package of claim 16, wherein the first insulating layer includes polyimide, and the second insulating layer includes polyurethane.

18. The COF package of claim 16, wherein a length of the second insulating layer is in a range of from about 1.5 mm to about 3.0 mm.

19. The COF package of claim 16, wherein the first elastic modulus is greater than the third elastic modulus.

* * * * *